United States Patent
Carey et al.

(10) Patent No.: US 9,792,971 B2
(45) Date of Patent: Oct. 17, 2017

(54) METHOD AND SYSTEM FOR PROVIDING MAGNETIC JUNCTIONS WITH RARE EARTH-TRANSITION METAL LAYERS

(71) Applicant: Samsung Electronics Co., LTD., Gyeonggi-do (KR)

(72) Inventors: Matthew J. Carey, San Jose, CA (US); Dmytro Apalkov, San Jose, CA (US); Keith Chan, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 49 days.

(21) Appl. No.: 14/730,379

(22) Filed: Jun. 4, 2015

(65) Prior Publication Data
US 2016/0005449 A1    Jan. 7, 2016

Related U.S. Application Data

(60) Provisional application No. 62/020,297, filed on Jul. 2, 2014.

(51) Int. Cl.
*H01L 29/82* (2006.01)
*G11C 11/16* (2006.01)
(Continued)

(52) U.S. Cl.
CPC ........ *G11C 11/161* (2013.01); *G11C 11/1675* (2013.01); *H01L 43/08* (2013.01); *H01L 43/12* (2013.01)

(58) Field of Classification Search
CPC ..... H01L 43/08; H01L 29/82; H01L 23/5226; H01L 23/528; H01L 27/222; H01L 43/065; G11C 11/16
(Continued)

(56) References Cited

U.S. PATENT DOCUMENTS

| | | | | |
|---|---|---|---|---|
| 5,841,611 A | * | 11/1998 | Sakakima | B82Y 10/00 257/E21.665 |
| 6,967,863 B2 | | 11/2005 | Huai | |

(Continued)

OTHER PUBLICATIONS

Nakayama, M., et al., "Spin transfer switching in TbCoFe/CoFeB/MgO/CoFeB/TbCoFe magnetic tunnel junctions with perpendicular magnetic anisotropy," Journal of Applied Physics, vol. 103, No. 7, pp. 07A710-3, Apr. 2008, DOI: 10.1063/1.2838335.

(Continued)

*Primary Examiner* — Jami M Valentine
(74) *Attorney, Agent, or Firm* — Convergent Law Group LLP

(57) ABSTRACT

A magnetic junction usable in magnetic devices is described. The magnetic junction includes a reference layer, a free layer, a nonmagnetic spacer layer between the reference and free layers, and a rare earth-transition metal (RE-TM) layer in the reference and/or free layers. The free layer is switchable between stable magnetic states when a write current is passed through the magnetic junction. If the RE-TM layer is in the free layer then the RE-TM layer is between hard and soft magnetic layers in the free layer. In this aspect, the RE-TM layer has a standby magnetic moment greater than a write magnetic moment. If the RE-TM layer is in the reference layer, then the magnetic junction includes a second RE-TM layer. In this aspect, a first saturation magnetization quantity of the RE-TM layer matches a second saturation magnetization quantity of the second RE-TM layer over an operating temperature range.

19 Claims, 9 Drawing Sheets

(51) Int. Cl.
  *H01L 43/12* (2006.01)
  *H01L 43/08* (2006.01)
(58) Field of Classification Search
  USPC .................. 257/421–427, E29.323; 438/3;
       365/324–326, 313; 360/157–158,
       360/171–173
  See application file for complete search history.

(56) References Cited

U.S. PATENT DOCUMENTS

| | | | |
|---|---|---|---|
| 7,985,994 | B2 | 7/2011 | Zheng |
| 8,208,295 | B2 | 6/2012 | Dieny |
| 8,254,162 | B2 | 8/2012 | Butler |
| 8,305,801 | B2 | 11/2012 | Daibou |
| 8,416,620 | B2 | 4/2013 | Zheng |
| 8,488,375 | B2 | 7/2013 | Saida |
| 8,514,617 | B2 | 8/2013 | Yamada |
| 8,553,450 | B2 | 10/2013 | Hosotani |
| 8,565,010 | B2 | 10/2013 | Zhou |
| 2005/0185455 | A1* | 8/2005 | Huai .................. B82Y 25/00 365/171 |
| 2006/0062132 | A1 | 3/2006 | VanKesteren |
| 2006/0255383 | A1* | 11/2006 | Kaiser ................. H01L 43/10 257/295 |
| 2007/0074317 | A1* | 3/2007 | Pakala ................ B82Y 25/00 257/108 |
| 2009/0147567 | A1* | 6/2009 | Chen .................. G11C 11/1675 365/173 |
| 2010/0109110 | A1 | 5/2010 | Wang |
| 2012/0018823 | A1 | 1/2012 | Huai |
| 2012/0056283 | A1 | 3/2012 | Yamane |
| 2013/0052483 | A1 | 2/2013 | Tahmasebi |
| 2013/0059168 | A1 | 3/2013 | Tahmasebi |
| 2013/0069182 | A1 | 3/2013 | Ohsawa |
| 2013/0221459 | A1 | 8/2013 | Jan |
| 2014/0015073 | A1 | 1/2014 | Lee |
| 2014/0070341 | A1* | 3/2014 | Beach .................. H01L 29/82 257/421 |
| 2014/0145792 | A1* | 5/2014 | Wang .................. H01F 10/3272 331/94.1 |
| 2014/0169082 | A1* | 6/2014 | Worledge ............. G11C 11/161 365/158 |
| 2016/0005956 | A1* | 1/2016 | Tang ..................... H01L 43/08 257/421 |

OTHER PUBLICATIONS

L.X. Ye, "Fabrication of perpendicular MgO-based magnetic tunnel junctions with TbFe/FeCo electrodes," Magnetics, IEEE Trans. on, vol. 47, No. 10, pp. 3857-3859, Oct. 2011, DOI: 10.1109/TMAG.2011.2157117.

Lau, J.W., "Magnetic nanostructures for advanced technologies: fabrication, metrology and challenges," Journal of Physics D: Applied Physics, vol. 44, No. 30, 303001, Jul . 7, 2011, DOI: 10.1088/0022-3727/44/30/303001.

Markarov, A., "Structural optimization of MTJs with a composite free layer," Proc. of the SPIE, vol. 8813, pp. 9, Sep. 2013, DOI: 10.1117/12.2025568.

* cited by examiner

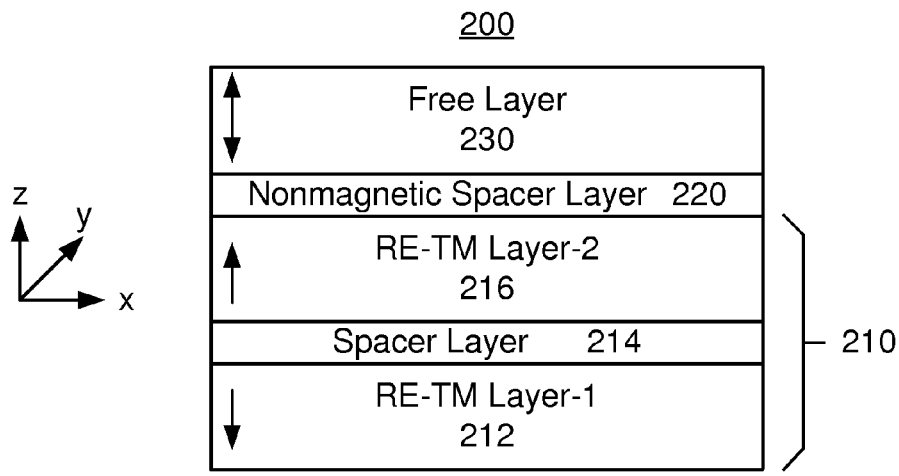
FIG. 3
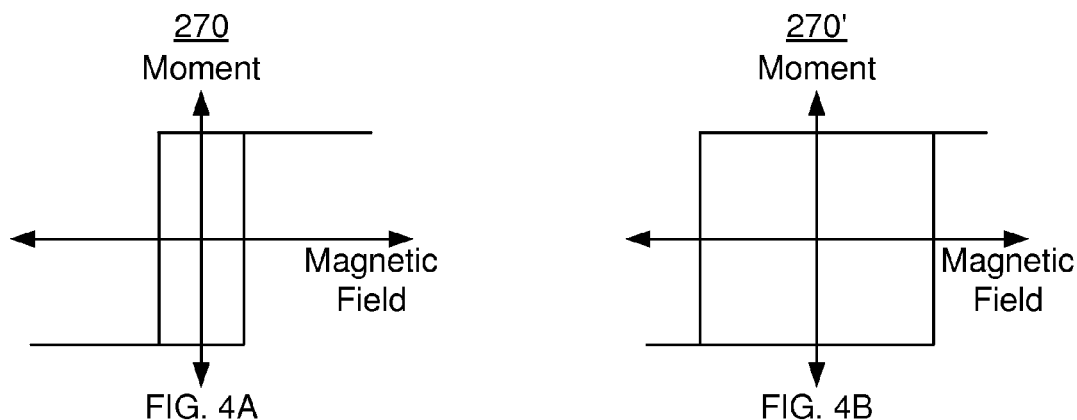
FIG. 4A
FIG. 4B
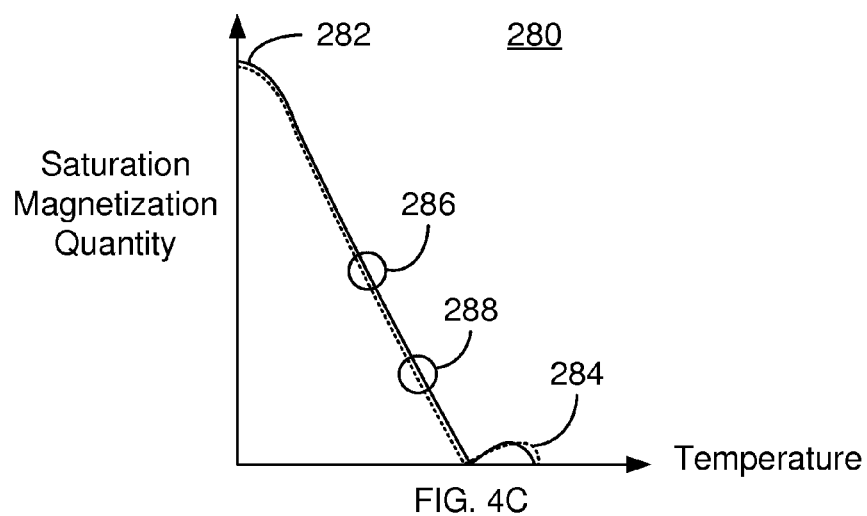
FIG. 4C

260

| Opt'l RE-TM Layer Alloy (w/ Desired Stoichiometry, Doping, Oxygen etc.) 261-2 |
|---|
| RE-TM Layer Alloy (w/ Desired Stoichiometry, Doping, Oxygen etc.) 261-1 |

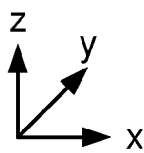

| ↑ | Transition Metal | 264-7 |
|---|---|---|
| ↓ | RE-TM Layer Alloy | 262-6 |
| ↑ | Transition Metal | 264-6 |
| ↓ | RE-TM Layer Alloy | 262-5 |
| ↑ | Transition Metal | 264-5 |
| ↓ | RE-TM Layer Alloy | 262-4 |
| ↑ | Transition Metal | 264-4 |
| ↓ | RE-TM Layer Alloy | 262-3 |
| ↑ | Transition Metal | 264-3 |
| ↓ | RE-TM Layer Alloy | 262-2 |
| ↑ | Transition Metal | 264-2 |
| ↓ | RE-TM Layer Alloy | 262-1 |
| ↑ | Transition Metal | 264-1 |

FIG. 12

METHOD AND SYSTEM FOR PROVIDING MAGNETIC JUNCTIONS WITH RARE EARTH-TRANSITION METAL LAYERS

CROSS-REFERENCE TO RELATED APPLICATIONS

This application claims the benefit of provisional Patent Application Ser. No. 62/020,297, filed Jul. 2, 2014 entitled DUAL MTJ WITH RARE-EARTH TRANSITION METAL REFERENCE LAYERS WITH MATCHED TEMPERATURE DEPENDENCE OF MOMENT, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional dual magnetic tunneling junction (MTJ) 10 as it may be used in a conventional STT-MRAM. The conventional dual MTJ 10 typically resides on a bottom contact 11, and includes a conventional bottom pinned layer 12, a conventional bottom tunneling barrier layer 14, a free layer 16, a conventional top tunneling barrier layer 18, and a conventional top pinned layer 20. Also shown is top contact 22. Conventional contacts 11 and 22 are used in driving the current in a current-perpendicular-to-plane (CPP) direction, or along the z-axis as shown in FIG. 1.

The conventional pinned layers 12 and 20 and the conventional free layer 16 are magnetic. The magnetic moments 13 and 21 of the conventional pinned layers 12 and 20, respectively are fixed, or pinned. In some conventional MTJs, this is accomplished by an exchange-bias interaction with AFM layers (not shown in FIG. 1). The conventional dual MTJ 10 is shown with the magnetic moments 13 and 21 in the dual state (antiparallel). In other cases, the magnetic moments 13 and 21 may be in the antidual state (parallel).

The conventional free layer 16 has a changeable magnetization 17. To switch the magnetization 17 of the conventional free layer 16, a current is driven perpendicular to plane (in the z-direction). When a sufficient current is driven from the top contact 22 to the bottom contact 11, the magnetic moment 17 of the conventional free layer 16 may switch to be parallel to the magnetic moment 13 of the conventional pinned layer 12. When a sufficient current is driven from the bottom contact 11 to the top contact 22, the magnetization 17 of the free layer may switch to be antiparallel to that of the pinned layer 12. The differences in magnetic configurations correspond to different magnetoresistances and thus different logical states (e.g. a logical "0" and a logical "1") of the conventional MTJ 10. In the dual state shown in FIG. 1, the conventional dual magnetic junction 10 may be switched at a lower current than for a conventional single MTJ or a dual MTJ in the antidual state.

Because of their potential for use in a variety of applications, research in magnetic memories is ongoing. For example, mechanisms for improving the performance of STT-MRAM are desired. Accordingly, what is needed is a method and system that may improve the performance of the spin transfer torque based memories. The method and system described herein address such a need.

BRIEF SUMMARY OF THE INVENTION

A magnetic junction for use in a magnetic device is described. The magnetic junction includes a reference layer, a nonmagnetic spacer layer, a free layer and a first rare-earth transition metal (RE-TM) layer. The nonmagnetic spacer layer is between the free layer and the reference layer. The free layer is switchable between a plurality of stable magnetic states when a write current is passed through the magnetic junction. The first RE-TM layer is in at least one of the reference layer and the free layer. If the first RE-TM layer is in the free layer then the free layer includes a hard magnetic layer, a soft magnetic layer and the first RE-TM layer between the hard and soft magnetic layers. In this aspect, the first RE-TM layer has a standby magnetic moment in a standby temperature range and write magnetic moment in a write temperature range. The standby magnetic moment is greater than the write magnetic moment. If the first RE-TM layer is in the reference layer, then the magnetic junction includes a second RE-TM layer. The second RE-TM layer may be in the reference layer or in another reference layer. The first RE-TM layer has a first saturation magnetization quantity, such as a first saturation magnetization or a first saturation magnetization-thickness product. The second RE-TM layer has a second saturation magnetization quantity, such as a second saturation magnetization or a second saturation magnetization-thickness product. In this aspect, the first saturation magnetization quantity matches the second saturation magnetization quantity over at least an operating temperature range.

BRIEF DESCRIPTION OF SEVERAL VIEWS OF THE DRAWINGS

FIG. 3 depicts another exemplary embodiment of a magnetic junction usable in a magnetic memory programmable using spin transfer torque and which includes at least two rare earth-transition metal layers.

FIGS. 4A, 4B and 4C are graphs depicting exemplary embodiments of magnetic moment versus field at two temperatures and saturation magnetization versus temperature for an exemplary embodiment of a magnetic junction including at least two rare-earth transition metal layers.

FIG. 11 depicts an exemplary embodiment of a rare earth-transition metal layer that may be used in a magnetic junction.

FIG. 12 depicts another exemplary embodiment of a rare earth-transition metal layer that may be used in a magnetic junction.

DETAILED DESCRIPTION OF THE INVENTION

Figure 1:
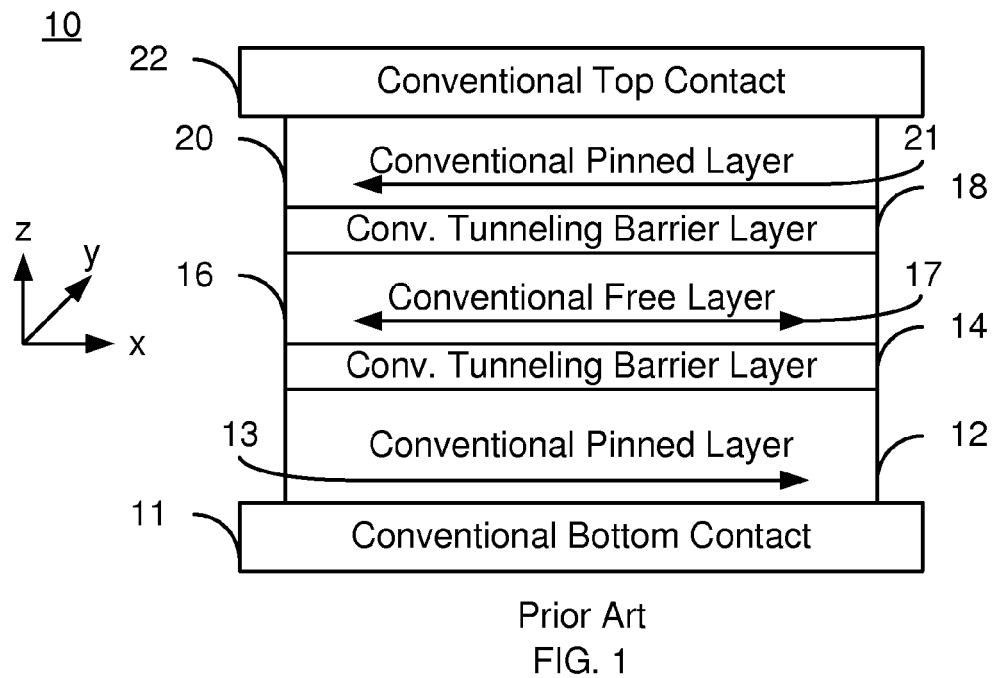
FIG. 1 depicts a conventional magnetic dual junction.

The exemplary embodiments relate to magnetic junctions usable in electronic devices, such as those using magnetic memories, and other devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments include magnetic junction(s) usable in magnetic device(s). For example, the magnetic junction(s) may be within magnetic storage cells for a magnetic memory programmable using spin transfer torque. The magnetic memories may be usable in electronic devices that make use of nonvolatile storage. Such electronic devices include but are not limited to cellular phones, tablets, and other mobile computing devices. The magnetic junction includes a reference layer, a nonmagnetic spacer layer, a free layer and a first rare-earth transition metal (RE-TM) layer. The nonmagnetic spacer layer is between the free layer and the reference layer. The free layer is switchable between a plurality of stable magnetic states when a write current is passed through the magnetic junction. The first RE-TM layer is in at least one of the reference layer and the free layer. If the first RE-TM layer is in the free layer then the free layer includes a hard magnetic layer, a soft magnetic layer and the first RE-TM layer between the hard and soft magnetic layers. In this aspect, the first RE-TM layer has a standby magnetic moment in a standby temperature range and write magnetic moment in a write temperature range. The standby magnetic moment is greater than the write magnetic moment. If the first RE-TM layer is in the reference layer, then the magnetic junction includes a second RE-TM layer. The second RE-TM layer may be in the reference layer or in another reference layer. The first RE-TM layer has a first saturation magnetization quantity, such as a first saturation magnetization or a first saturation magnetization-thickness product. The second RE-TM layer has a second saturation magnetization quantity, such as a second saturation magnetization or a second saturation magnetization-thickness product. In this aspect, the first saturation magnetization quantity matches the second saturation magnetization quantity over at least an operating temperature range.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon and other physical phenomenon. Consequently, one of ordinary skill in the art will readily recognize that theoretical explanations of the behavior of the method and system are made based upon this current understanding of spin transfer anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could be ferromagnetic, ferrimagnetic or like structures. The method and system are also described in the context of single and dual magnetic junctions. Other magnetic junctions may be used. The method is also explained in the context of magnetic memories having memory cells including a single magnetic junction. However, one of ordinary skill in the art will readily recognize that the method and system are consistent with the use of magnetic memories having multiple magnetic junctions per cell. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
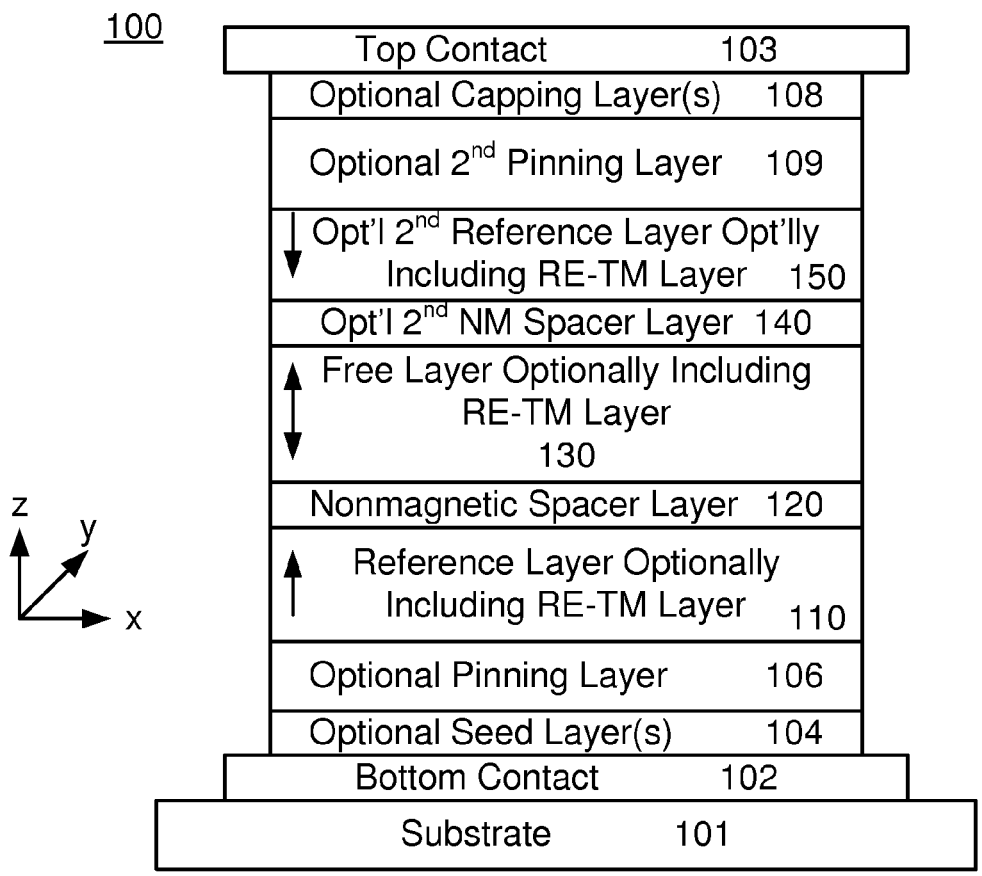
FIG. 2 depicts an exemplary embodiment of a magnetic junction usable in a magnetic memory programmable using spin transfer torque and which includes at least one rare earth-transition metal layer.

FIG. 2 depicts an exemplary embodiment of a magnetic junction 100 as well as surrounding structures. For clarity, FIG. 2 is not to scale. The magnetic junction may be used in a magnetic device such as a spin transfer torque random access memory (STT-MRAM) and, therefore, in a variety of electronic devices. The magnetic junction 100 includes a reference layer 110, a nonmagnetic spacer layer 120, a free layer 130, optional additional nonmagnetic spacer layer 140 and an optional additional reference layer 150. The magnetic junction 100 may also include optional seed layer(s) 104, optional pinning layer 106 for reference layer 110, optional pinning layer 109 for optional reference layer 150 and optional capping layer(s) 108. Also shown is an underlying substrate 101, bottom contact 102 and optional top contact 103. Devices including but not limited to a transistor may be formed in the substrate 101. If the layers 140 and 150 are omitted, the magnetic junction 100 is a single magnetic junction. If layers 140 and 150 are included, the magnetic junction 100 is a dual magnetic junction. Although layers 110, 120, 130, 140 and 150 are shown with a particular orientation with respect to the substrate 101, this orientation may vary in other embodiments. For example, the reference layer 110 may be closer to the top (furthest from a substrate) of the magnetic junction 100. In such an embodiment (in which layers 140, 150 and 109 are also omitted), the magnetic junction 100 would be a bottom free layer junction. If the reference layer 110 is closest to the substrate 101 and layers 140, 150 and 109 are omitted, the magnetic junction is a top free layer junction. The optional pinning layer(s) 106 and 109 may be used to fix the magnetization of the reference layer(s) 110 and 150, respectively. In some embodiments, the optional pinning layers 106 and 109 may be AFM layers or multilayers that pin the magnetizations of the pinned layers 110 and 150, respectively, by an exchange-bias interaction. However, in other embodiments, the optional pinning layers 106 and 109 may be omitted or another structure may be used. For example, if the perpendicular magnetic anisotropy energy of the reference layer 110 exceeds the out of plane demagnetization energy, the magnetic moment of the reference layer 110 may be out of plane (e.g. perpendicular-to-plane). This situation is shown in FIG. 2. In such embodiments, the pinning layer 106 may be omitted. Similarly, the magnetic moment of the optional reference layer 150 may be out-of-plane (e.g. perpendicular-to-plane) of the perpendicular magnetic anisotropy energy of the layer 150 exceeds the out-of-plane demagnetization energy. The magnetic junction 100 is also configured to allow the free layer 130 to be switched between stable magnetic states when a write current is passed through the magnetic junction 100. Thus, the free layer 130 is switchable utilizing spin transfer torque. In some embodiments, the free layer 130 is switched using only spin transfer torque. In other embodiments, spin transfer torque may be combined with other mechanisms to switch the free layer 130. For example, spin transfer torque may be combined with heating, an assist magnetic field and/or other phenomenon in switching the free layer 130.

The reference layer 110 is magnetic and may have its magnetization pinned, or fixed, in a particular direction. Although depicted as a simple layer, the reference layer 110 may include multiple layers. For example, the reference layer 110 may be a SAF including magnetic layers antiferromagnetically or ferromagnetically coupled through thin layers, such as Ru. In such a SAF, multiple magnetic layers interleaved with thin layer(s) of Ru or other material may be used. The reference layer 110 may also be another multilayer. In the embodiment depicted in FIG. 2, the reference layer 110 has a perpendicular anisotropy energy that exceeds the out-of-plane demagnetization energy. Thus, the reference layer 110 may have its magnetic moment oriented perpendicular-to-plane as shown. Other orientations of the magnetization of the reference layer 110 are possible. In other embodiments, for example, the magnetic moment of the reference layer 110 may be in-plane. The optional reference layer 150 is analogous to the reference layer 110. Thus, the optional reference layer 150 is magnetic and may have its magnetization pinned, or fixed, in a particular direction. Although depicted as a simple layer, the optional reference layer 150 may include multiple layers. For example, the optional reference layer 150 may be a SAF or other multilayer. In the embodiment depicted in FIG. 2, the optional reference layer 150 has a perpendicular anisotropy energy that exceeds the out-of-plane demagnetization energy. Thus, the optional reference layer 150 may have its magnetic moment oriented perpendicular-to-plane as shown. Other orientations of the magnetization of the optional reference layer 150 are possible. In other embodiments, for example, the magnetic moment of the optional reference layer 150 may be in-plane. There is no requirement that the reference layer 110 and the optional reference layer 150 be the same in a magnetic junction in which both are present.

The spacer layer 120 is nonmagnetic. In some embodiments, the spacer layer 120 is an insulator, for example a tunneling barrier. In such embodiments, the spacer layer 120 may include crystalline MgO, which may enhance the TMR of the magnetic junction as well as the perpendicular magnetic anisotropy of the free layer 130. In other embodiments, the spacer layer 120 may be a conductor, such as Cu. In alternate embodiments, the spacer layer 120 might have another structure, for example a granular layer including conductive channels in an insulating matrix. The optional spacer layer 140 is analogous to the spacer layer 120. Thus, the optional spacer layer 140 is nonmagnetic and may be a tunneling barrier. In such embodiments, the spacer layer 120 may include crystalline MgO. In other embodiments, the spacer layer 120 may be a conductor, such as Cu. In alternate embodiments, the spacer layer 120 might have another structure, for example a granular layer including conductive channels in an insulating matrix. There is, however, no requirement that the spacer layers 120 and 140 be the same if both are present in the magnetic junction 100.

The free layer 130 is magnetic and is written using a current driven through the magnetic junction 100. In some embodiments, the free layer 130 is a multilayer. For example, the free layer 130 maybe a SAF and/or may include multiple adjoining ferromagnetic layers that are exchange coupled. Other multilayers may also be used. The layers in the multilayer may be single elements, alloys, and may include nonmagnetic layers. In other embodiments, the free layer 130 may be a single layer. In the embodiment depicted in FIG. 2, the free layer 130 has a perpendicular anisotropy energy that exceeds the out-of-plane demagnetization energy. Thus, the free layer 130 may have its magnetic moment oriented perpendicular-to-plane as shown. Because this magnetic moment is switchable, it is depicted as a dual headed arrow in FIG. 2. In other embodiments, other directions are possible for the magnetic moment of the free layer 130. For example, the free layer 130 may have its magnetic moment stable in-plane or at an angle from the z-direction. The free layer 130 is thermally stable when the magnetic junction 100 is not being written (quiescent/in standby mode). The free layer 130 is also characterized by a magnetic thermal stability coefficient, $\Delta$. In some embodiments, therefore, the magnetic thermal stability coefficient, $\Delta$, of the free layer 130 is at least sixty at non-programming operating temperatures, or standby temperatures. In some such embodiments, the magnetic thermal stability coefficient is at least eighty in a standby temperature range.

The magnetic junction 100 also includes at least one rare earth-transition metal (RE-TM) layer (not explicitly shown in FIG. 2). The RE-TM layer(s) can be in the reference layer 110, the reference layer 150 and/or the free layer 130. For example, the RE-TM layer(s) may be only in the reference layer 110, only in the reference layer 150, in both the reference layers 110 and 150, only in the free layer 130, in the free layer 130 and the reference layer 110, in the free layer 130 and the reference layer 150, or in all layers 110, 130 and 150.

A RE-TM layer includes an alloy of a rare earth (RE) and a transition metal (TM). For example, such alloys might include $Tb_x(Fe_yCo_{1-y})_{1-x}$, $Tb_xCo_{1-x}$, $Tb_xFe_{1-x}$, $Gd_xCo_{1-x}$, $Gd_x(Fe_yCo_{1-y})_{1-x}$ and $Gd_xFe_{1-x}$, where x and y are each greater than zero and less than one. Other RE-TM alloys might also be used. The concentration of the rare earth(s) and transition metal(s) may be controlled to tune various properties of the RE-TM alloy. For example, the concentration of Fe may be adjusted to modify the saturation magnetization of the RE-TM alloy. In addition, the RE-TM alloys may also be doped. For example, doping with B may tune the critical temperature (temperature at which the saturation magnetization goes to zero and remains zero). Materials such as B, Cu, Zr, Al, Si and other dopants may be used to control local order. For example, the dopant may affect the crystallographic positions of the rare earth atoms in the alloy. The amount of oxygen, hydrogen and other light elements may also be controlled during fabrication to ensure that the RE-TM alloy used in the RE-TM layer has the desired properties. For example, mechanisms for ensuring a low oxygen or hydrogen content in RE-TM alloy may be used during deposition of the film.

The RE-TM layer may be a single layer including the RE-TM alloy or a multilayer. If a single layer of RE-TM alloy is used, the alloy may have a varying concentration of one or more of the constituents (and/or dopants) in order to tailor the properties of the RE-TM layer. For a multilayer, the RE-TM layer might include sublayers. These sublayers may include various materials. For example, different RE-TM alloys may be used for some or all of the sublayers. RE-TM sublayers may be used in conjunction with another metal. For example, a RE-TM sublayer(s) of TbCo may be alternated with Fe sublayer(s) to form a multilayer RE-TM layer. Note that when alloys are mentioned herein, the lack of a subscript does not indicate a particular stoichiometry. For example, TbCo, is a $Tb_xCo_{1-x}$, where x is less than one and greater than zero.

If the RE-TM layer is present in the free layer 130, then the RE-TM layer may be coupling layer. In such an embodiment, the free layer 130 includes a soft ferromagnetic layer, a hard ferromagnetic layer and a RE-TM layer between the soft and hard magnetic layers. For example, the soft layer might include materials such as one or more of CoFeB, Fe rich layers and/or other magnetically soft materials (e.g. coercivity less than one hundred Oe). The hard materials may include materials such as at least one CoPt, CoCrPt, their alloys, their multilayers and/or other magnetically hard materials (e.g. coercivity greater than two hundred Oe and typically greater than one thousand Oe). In such an embodiment, the magnetic moment of the RE-TM layer is smaller during writing than during standby or other operation of the magnetic junction 100. For example, during standby, the magnetic junction 100 is usually at or near room temperature (roughly 20-30 degrees Celsius) and is generally at a temperature of less than one hundred degrees Celsius. In some cases, the magnetic junction 100 may be cooled to below room temperature during standby. During operation of the magnetic junction, the temperature of the magnetic junction 100 may be elevated. The operating temperature range includes temperatures from standby up to at least write temperature(s). During reading of the magnetic junction 100 or use of the electronic device in which the magnetic junction 100 resides other than for programming the magnetic junction 100, the temperature of the magnetic junction 100 may be elevated somewhat. For example, the temperature of the magnetic junction 100 may be above room temperature and less than approximately two hundred degrees Celsius. The highest temperatures are general reached during writing, when a current is driven through the magnetic junction 100 and, therefore, through the free layer 130. For example, during a write operation to the magnetic junction 100, the temperature of the magnetic junction 100 may be greater than two hundred degrees Celsius and may be as high as two hundred fifty degrees Celsius to three hundred degrees Celsius. Other standby, operating and write temperatures are possible. The RE-TM layer in the free layer 130 is configured such that the magnetic moment of the RE-TM layer is lower in the write temperature range than in the standby and other operational temperature ranges. For example, during a write operation, the moment of the RE-TM layer is less than half of the moment at room temperature. In some embodiments, the moment RE-TM layer is less than one tenth of the room temperature magnetic moment.

Because the moment of the RE-TM layer is reduced during writing, the coupling between the hard and soft magnetic layers of the free layer 130 may be reduced during writing. In such embodiments, the free layer 130 may be written at a lower current than if the RE-TM layer had the same or a higher magnetic moment. Thus, performance of the magnetic junction 100 may be improved.

As discussed above, the RE-TM layer is in one or more of the layers 110, 130 and 150. If the RE-TM layer is in one or both of the reference layers 110 and 150, then the magnetic junction 100 includes at least two RE-TM layers.

A first RE-TM layer of the two has a first saturation magnetization quantity. The second RE-TM layer has a second saturation magnetization quantity. A saturation magnetization quantity is a quantity related to the magnetic moment of the corresponding RE-TM layer. For example, the saturation magnetization quantity may simply be the saturation magnetization, the magnetic moment, a saturation magnetization-thickness product (the saturation magnetization multiplied by the thickness of the RE-TM layer), or some combination thereof for the RE-TM layer. The saturation magnetization quantities of the first and second RE-TM layers match over at least the operating temperature range (i.e. at least from standby through write temperatures). As used herein, "matching" includes but is not limited to a perfect match. For example, in some embodiments, the magnetic moments of the first and second RE-TM layers may be equal over the operating temperature range. In other embodiments, the magnetic moments may differ at least slightly over at least a portion of the operating temperature range. For example, the magnetic moments may differ by no more than one hundred emu/cc over at least the operating temperature range. The saturation magnetization-thickness products may be equal and/or may differ by not more than ten milli-emu/cm² over at least the operating temperature range. The saturation magnetizations may be equal or differ by no more than fifty thousand A/m over at least the operating temperature range. In other embodiments, the magnetic moments, saturation magnetization-thickness products and/or saturation magnetizations may differ by different amount(s) over the operating temperature range. In some embodiments, matching saturation magnetization quantities mean that the RE-TM layers include the same materials. However, in other embodiments, different materials may be used in the RE-TM layers.

Because these saturation magnetization quantities match throughout the operating temperature range, the shift field at the free layer 130 may be at or near zero. Because of the orientation of the ferrimagnetic RE-TM layers, the locations of the RE-TM layers, and the matching saturation magnetization quantities, the net field exerted by the RE-TM layers may be at or near zero at the free layer. Stated differently, the shift field at the free layer 130 may be substantially zero. For example, in some embodiments, the shift field at the free layer 130 is not more than fifty Oe throughout the operating temperature range. In some embodiments, the stray field at the free layer 130 may be not more than twenty Oe. For example, the stray field at the free layer 130 may be not more than ten Oe throughout the operating temperature range.

The RE-TM layers may be located in one or both of the reference layers 110 and 150 for a matching saturation magnetization quantity and substantially zero shift field at the free layer 130. For a single magnetic junction, in which the reference layer 110 or 150 are omitted, both RE-TM layers are within the same reference 150 or 110, respectively. In such an embodiment, the RE-TM layers are antiferromagnetically aligned and may be antiferromagnetically coupled. In a dual magnetic junction 100 including two RE-TM layers, then both RE-TM layers may be in the same reference layer 110 or 150 and configured as for a single magnetic junction. In a dual magnetic junction 100 including two RE-TM layers, then one RE-TM layer may be in one reference layer 110, while the other RE-TM layer may be in the other reference layer 150. In such a case, the RE-TM layers may be antiferromagnetically aligned. In other embodiments, two RE-TM layers may be in each of the reference layers 110 and 150. In such a case, one RE-TM layer in one reference layer 110 may match another RE-TM layer in the other reference layer or both RE-TM layers in each reference layer 110 and 150 may match.

In a write operation, a write current is driven through the magnetic junction 100 in the current perpendicular-to-plane (CPP) configuration to program the magnetic junction 100. In FIG. 2, the write current is driven between the contacts 102 and 103, substantially in the z-direction. The magnetic junction 100 is programmed using at least spin transfer. Other mechanisms, such as an external magnetic field and/or a spin orbit coupling, might also be employed.

In a read operation, a read current that is less than the write current is driven through the magnetic junction 100. The read current may also be driven in the CPP direction. Based on the magnetoresistance of the magnetic junction 100, the state of the magnetic moment (in the z-direction or in the negative z-direction) of the free layer 130 may be determined. Note that for a dual magnetic junction, the nonmagnetic spacer layers 120 and 140 may be configured differently to be able to distinguish the magnetic states of the free layer 130.

Because the saturation magnetization quantities of the RE-TM layers in the reference layer(s) 110 and/or 150 match, the shift field at the free layer from the RE-TM layers is substantially zero over at least the operating temperature range of the magnetic junction 100. The hysteresis loops (moment versus applied magnetic field) for the free layer 130 may thus be symmetric. Consequently, the magnetic junction 100 may be more accurately read and programmed while allowing RE-TM layers to be used in the reference layer(s) 110 and/or 150. Performance of the magnetic junction 100 may thus be improved.

Note that various features relating to the RE-TM layer(s) are discussed above with respect to the magnetic junction 100 and highlighted in the discussion below. Various features and configurations may be combined in a manner not inconsistent with the method and system that are not explicitly described. For example, the RE-TM layers may be included in both the free layer and one or more of the reference layer.

FIG. 3 depicts another exemplary embodiment of a magnetic junction 200 usable in a magnetic memory programmable using spin transfer torque and which includes at least two rare earth-transition metal layers. For clarity, FIG. 3 is not to scale and only some portions of the magnetic junction 200 may be shown. FIGS. 4A, 4B and 4C are graphs 270, 270' and 280, respectively, depicting exemplary embodiments of magnetic moment versus field at a standby temperature range, magnetic moment versus magnetic field in a write temperature range, and saturation magnetization versus temperature for the magnetic junction 200. Referring to FIGS. 3, 4A, 4B and 4C, the magnetic junction 200 may be used in a magnetic device such as a STT-MRAM and, therefore, in a variety of electronic devices. The magnetic junction 200 is analogous to the magnetic junction 100. Consequently, analogous components are labeled similarly. Thus, the magnetic junction 200 includes a reference layer 210, a nonmagnetic spacer layer 220, and a free layer 230 that are analogous to the layers 110, 120 and 130, respectively, for the magnetic junction 100. For simplicity, no other layers are shown. Thus, the underlying substrate 101, contacts 102 and 103, optional seed layer 104, optional pinning layers 106 and 109, and optional capping layer 108 depicted with the magnetic junction 100 are not shown in FIG. 3. In the embodiment shown in FIG. 3, therefore, the magnetic junction 200 is a single magnetic junction including only one nonmagnetic spacer layer 220. Although the free layer 230 is shown as on top of (e.g. further from the substrate than) the reference layer 210, in other embodiments, the order of the layers 210, 220 and 230 may be reversed.

The free layer 230 is analogous to the free layer 130. Thus, the free layer 230 is switchable between stable magnetic states using spin transfer. In the embodiment shown, the free layer 230 is a single layer. However, in other embodiments, the free layer 230 may be a multilayer. The magnetic moment of the free layer 230 is also shown as perpendicular to plane. Thus, the stable states of the free layer 230 are along the z-axis. In other embodiments, the stable states of the free layer 230 may be in other directions.

The nonmagnetic spacer layer 220 is analogous to the nonmagnetic spacer layer 120. The nonmagnetic spacer layer 220 may thus be a tunneling barrier layer, a conductive layer, or another layer.

The magnetic junction 200 also include a first RE-TM layer 212. In the embodiment shown, the first RE-TM layer 212 is within the reference layer 210. Because the RE-TM layer 212 is in the reference layer 210, the magnetic junction 200 contains a second RE-TM layer 216. The RE-TM layer 216 is also part of the reference layer 210. The reference layer also includes the spacer layer 214, which is nonmagnetic and may include Ru. The RE-TM layers 212 and 216 are antiferromagnetically aligned. In some embodiments, the RE-TM layers 212 and 216 are antiferromagnetically coupled. The reference layer 210 is a SAF in such embodiments. The RE-TM layers 212 and 216 also have perpendicular magnetic anisotropies that exceed their out of plane demagnetization energies. Consequently, the magnetic moments of the RE-TM layers 212 and 216 may be perpendicular to plane.

The RE-TM layers 212 and 216 have matching saturation magnetization quantities. For example, the saturation magnetization of the RE-TM layer 212 may match that of the RE-TM layer 216 over the operating temperature range of the magnetic junction 200. Similarly, the saturation magnetization-thickness product (saturation magnetization multiplied by the thickness in the z-direction) and/or the magnetic moment of the RE-TM layers 212 and 216 may match over the operating temperature range. As discussed above, matching includes but is not limited to a perfect match. Instead, the RE-TM layers 212 and 216 may match to within the limits described above. The RE-TM layers 212 and 216 may be formed of the same materials or may include different constituents.

The matching saturation magnetization quantities of the RE-TM layers 212 and 216 may be understood using the graph 280 depicted in FIG. 4C. The curve 282 depicts the saturation magnetization versus temperature for the RE-TM layers 212 and 216. The curve 284 corresponds to the RE-TM layer 212 while the curve 286 corresponds to the RE-TM layer 216. Note that if the layers 212 and 216 were identical, the curves 282 and 284 would be a single curve indicating a perfect match. Area 286 corresponds to the standby temperature range, while area 288 corresponds to the write temperature range. The operating temperature range include at least the temperatures corresponding to the area 286 through the temperatures corresponding to the area 288. As can be seen in FIG. 4C, the curves 282 and 284 match throughout the operating temperature range.

Because the saturation magnetization quantities of the RE-TM layers 212 and 216 match, performance of the magnetic junction 200 may be improved. The graph 270 of FIG. 4A depicts the moment versus applied magnetic field for the free layer 230 in the standby temperature range (area 286 in FIG. 4C). As can be seen in FIG. 4A, the hysteresis loop is symmetric with respect to zero field. The graph 270' of FIG. 4B depicts the magnetic moment versus applied magnetic field for the free layer 230 in the write temperature range (area 288 in FIG. 4C). AS can be seen in FIG. 4B, the hysteresis loop is still symmetric with respect to zero applied magnetic field. Thus, the shift field is substantially zero for the magnetic junction 200. As a result, the magnetic junction 200 may be symmetric for read and write operations. In addition, ferrimagnetic RE-TM layers such as the layers 212 and 216 may be used in the magnetic junction 200. Thus, performance of the magnetic junction 200 may be improved.

Figure 5:
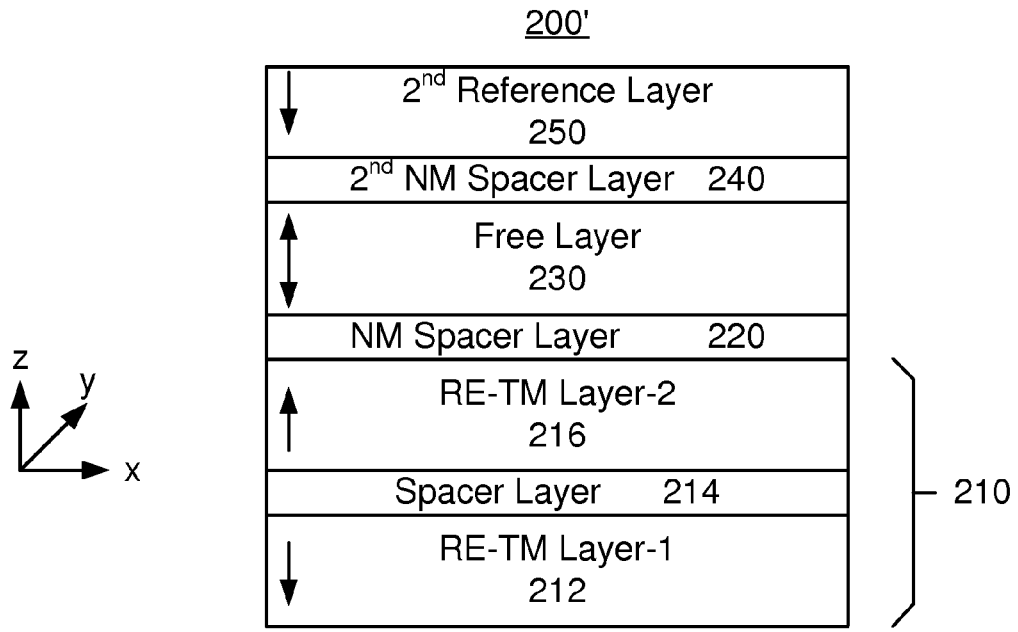
FIG. 5 depicts an exemplary embodiment of a dual magnetic junction usable in a magnetic memory programmable using spin transfer torque and which includes at least two rare earth-transition metal layers.

FIG. 5 depicts another exemplary embodiment of a magnetic junction 200' usable in a magnetic memory programmable using spin transfer torque and which includes at least two rare earth-transition metal layers. For clarity, FIG. 5 is not to scale and not all of the magnetic junction 200' may be shown. The magnetic junction 200' may be used in a magnetic device such as a STT-MRAM and, therefore, in a variety of electronic devices. The magnetic junction 200' is analogous to the magnetic junction 200 and thus to the magnetic junction 100. Consequently, analogous components are labeled similarly. Thus, the magnetic junction 200' includes a reference layer 210, a nonmagnetic spacer layer 220, and a free layer 230 that are analogous to the layers 210, 220 and 230, respectively, for the magnetic junction 200. For simplicity, no other layers such as seed, capping, and contact layers, are shown.

In the embodiment shown in FIG. 5, therefore, the magnetic junction 200' is a dual magnetic junction including an additional spacer layer 240 and an additional reference layer 250 that are analogous to the layers 140 and 150, respectively, of the magnetic junction. The additional spacer layer 240 is analogous to the spacer layer 220. The reference layer 250 is magnetic and depicted as having a perpendicular magnetic anisotropy energy that exceeds the out-of-plane demagnetization energy. Thus, the magnetic moment of the reference layer 250 is perpendicular to plane. Although depicted as a single layer, the reference layer 250 may be a multilayer. In some embodiments, the reference layer 250 may be a SAF. The nonmagnetic spacer layer 240 may thus be a tunneling barrier layer, a conductive layer, or another layer. In addition, the layers 210, 220, 240 and 250 are configured such that the stable states of the magnetic junction 200' are distinguishable via magnetoresistance. For example, the spacer layer 220 may be thicker than the spacer layer 240. Further, the reference layers 210 and 250 are depicted with the magnetic moments in a dual state. In other embodiments, the magnetic moments may be in an antidual state or switchable between dual and antidual states.

In the magnetic junction 200', the RE-TM layers 212 and 216 both reside within the reference layer 210. The saturation magnetization quantities of the RE-TM layers 212 and 216 are also configured in a manner analogous to the junction 200. Thus, the saturation magnetization quantities of the RE-TM layers 212 and 216 match as described above.

Because the saturation magnetization quantities of the RE-TM layers 212 and 216 match, performance of the magnetic junction 200' may be improved. Matching the saturation magnetization quantities of the layers 212 and 216 allows for, the shift field is substantially zero at the free layer 230. As a result, the magnetic junction 200' may be symmetric for read and write operations. Thus, performance of the magnetic junction 200' may be improved.

Figure 6:
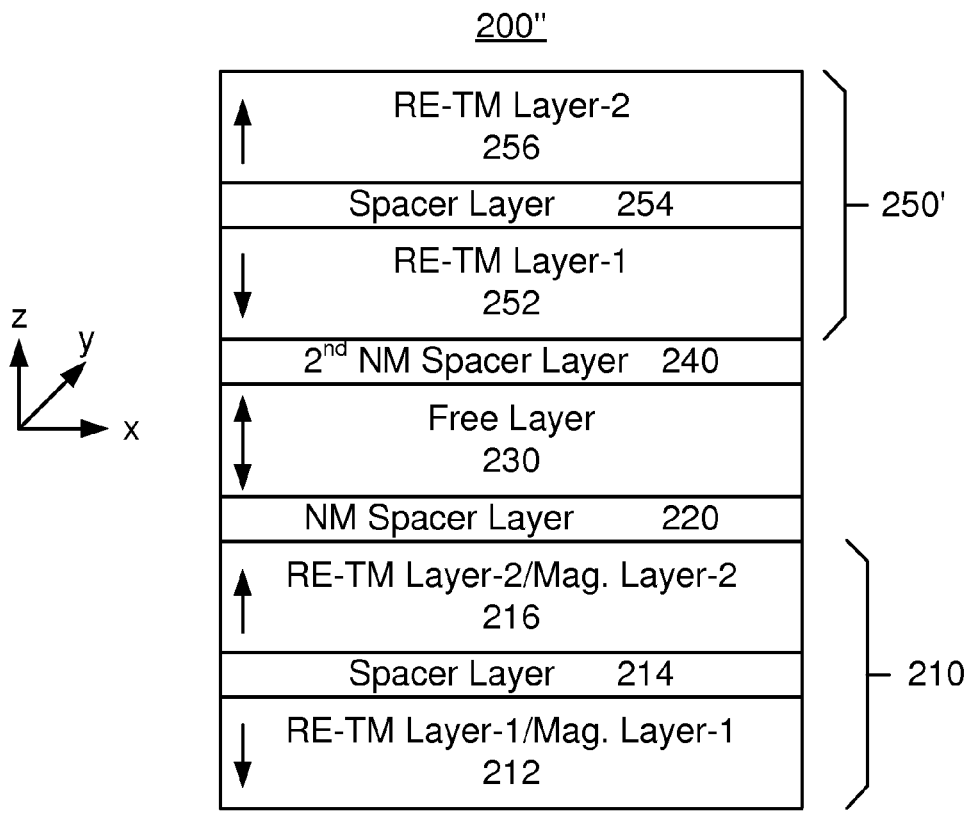
FIG. 6 depicts another exemplary embodiment of a dual magnetic junction usable in a magnetic memory programmable using spin transfer torque and which includes at least two rare earth-transition metal layers.

FIG. 6 depicts another exemplary embodiment of a magnetic junction 200" usable in a magnetic memory programmable using spin transfer torque and which includes at least two rare earth-transition metal layers. For clarity, FIG. 6 is not to scale and not all of the magnetic junction 200" may be shown. The magnetic junction 200″ may be used in a magnetic device such as a STT-MRAM and, therefore, in a variety of electronic devices. The magnetic junction 200″ is analogous to the magnetic junction 200 and/or 200′ and thus to the magnetic junction 100. Consequently, analogous components are labeled similarly. Thus, the magnetic junction 200″ includes a reference layer 210, a nonmagnetic spacer layer 220, a free layer 230, an additional nonmagnetic spacer layer 240 and an additional pinned layer 250 that are analogous to the layers 210, 220, 230, 240 and 250, respectively, for the magnetic junctions 200 and/or 200′. In addition, the layers 210, 220, 240 and 250′ are configured such that the stable states of the magnetic junction 200″ are distinguishable via magnetoresistance. Further, the reference layers 210 and 250′ are depicted with the magnetic moments in a dual state. In other embodiments, the magnetic moments may be in an antidual state or switchable between dual and antidual states. For simplicity, no other layers such as seed, capping, and contact layers, are shown.

In the embodiment shown in FIG. 6, the reference layer 250′ also includes two RE-TM layers 252 and 256 separated by a nonmagnetic layer 254. The RE-TM layers 252 and 256 may be antiferromagnetically aligned. In some embodiments, the RE-TM layers 252 and 256 are antiferromagnetically coupled. Thus, the reference layer 250′ may be a SAF. The spacer layer 254 is nonmagnetic and may be a material such as Ru.

Thus, the magnetic junction 200″ includes four RE-TM layers 212, 216, 252 and 256. The magnetic junction 200″ is configured such that the saturation magnetization quantities of the RE-TM layers 212, 216, 252 and 256 match. In some embodiments, the RE-TM layers 212 and 216 within the reference layer 210 have matching saturation magnetization quantities at least within the operating temperature range. In such embodiments, the RE-TM layers 252 and 256 within the reference layer 250 have matching saturation magnetization quantities at least in the operating temperature range. In another embodiment, the RE-TM layer 212 may have a saturation magnetization quantity matching that of the RE-TM layer 256. In such embodiments, the RE-TM layer 216 may have a saturation magnetization quantity matching that of the RE-TM layer 252. In other embodiments, other combination(s) of the RE-TM layers 212, 216, 252 and 256 have matching saturation magnetization quantities such that the shift field at the free layer 230 is substantially zero.

Because the saturation magnetization quantities of the RE-TM layers 212, 216, 252 and 256 match, performance of the magnetic junction 200″ may be improved. Matching the saturation magnetization quantities of the layers 212, 216, 252 and 256 allows for the shift field is substantially zero at the free layer 230. As a result, the magnetic junction 200″ may be symmetric for read and write operations while utilizing RE-TM alloys. Thus, performance of the magnetic junction 200″ may be improved.

Figure 7:
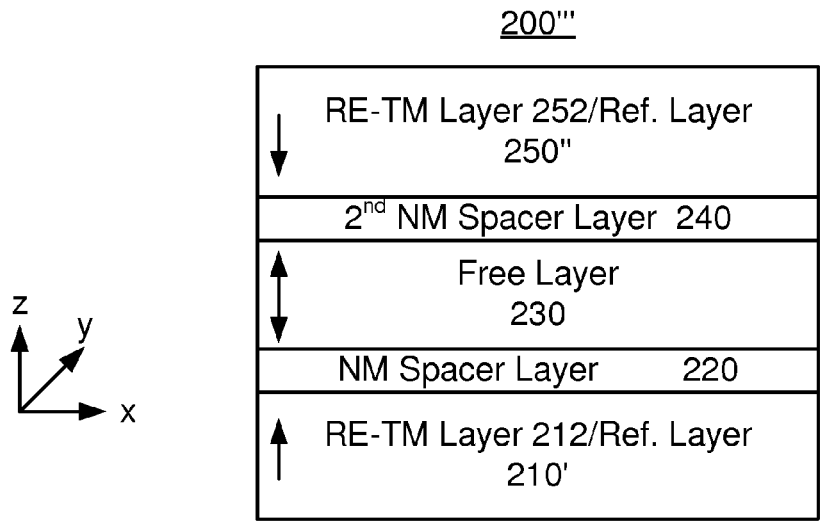
FIG. 7 depicts another exemplary embodiment of a dual magnetic junction usable in a magnetic memory programmable using spin transfer torque and which includes at least two rare earth-transition metal layers.

FIG. 7 depicts another exemplary embodiment of a magnetic junction 200′″ usable in a magnetic memory programmable using spin transfer torque and which includes at least two rare earth-transition metal layers. For clarity, FIG. 7 is not to scale and not all of the magnetic junction 200′″ may be shown. The magnetic junction 200′″ may be used in a magnetic device such as a STT-MRAM and, therefore, in a variety of electronic devices. The magnetic junction 200′″ is analogous to the magnetic junction 200, 200′ and/or 200″ and thus to the magnetic junction 100. Consequently, analogous components are labeled similarly. Thus, the magnetic junction 200′″ includes a reference layer 210′, a nonmagnetic spacer layer 220, a free layer 230, an additional nonmagnetic spacer layer 240 and an additional pinned layer 250″ that are analogous to the layers 210, 220, 230, 240 and 250/250′, respectively, for the magnetic junctions 200, 200′ and/or 200″. In addition, the layers 210′, 220, 240 and 250″ are configured such that the stable states of the magnetic junction 200′″ are distinguishable via magnetoresistance. Further, the reference layers 210′ and 250″ are depicted with the magnetic moments in a dual state. In other embodiments, the magnetic moments may be in an antidual state or switchable between dual and antidual states. For simplicity, no other layers such as seed, capping, and contact layers, are shown.

In the embodiment shown in FIG. 7, the reference layers 210′ and 250″ each includes a RE-TM layer 212 and 252, respectively. In some embodiments, the reference layer 210′ consists of a single RE-TM layer 212. The reference layer 250″ consists of a single RE-TM layer 252 in some embodiments. Both of the reference layers 210′ and 250″ may consist of a single RE-TM layer 212 and 252, respectively. In other embodiments, the reference layers 210′ and 250″ may be multilayers including a single RE-TM layer 212 and 252, respectively. For example, the reference layer 210′ and/or 250″ may be a SAF in which one of the magnetic layers is an RE-TM layer 212 and/or 252, respectively.

The reference layers 250″ and 210′ are configured such that the RE-TM layers 212 and 252, respectively, have matching saturation magnetization quantities throughout the operating temperature range. The RE-TM layers 212 and 252 are also in the dual state, as shown for the reference layers 210′ and 250″, respectively, in FIG. 7. Consequently, the shift field at the free layer 230 is substantially zero.

Because the saturation magnetization quantities of the RE-TM layers 212 and 252/reference layers 210′ and 250″ match, performance of the magnetic junction 200′″ may be improved. Matching the saturation magnetization quantities of the layers 210′/212 and 250″/252 allows for the shift field is substantially zero at the free layer 230. As a result, the magnetic junction 200′″ may be symmetric for read and write operations while including RE-TM alloy(s). Thus, performance of the magnetic junction 200′″ may be improved.

Figure 8:
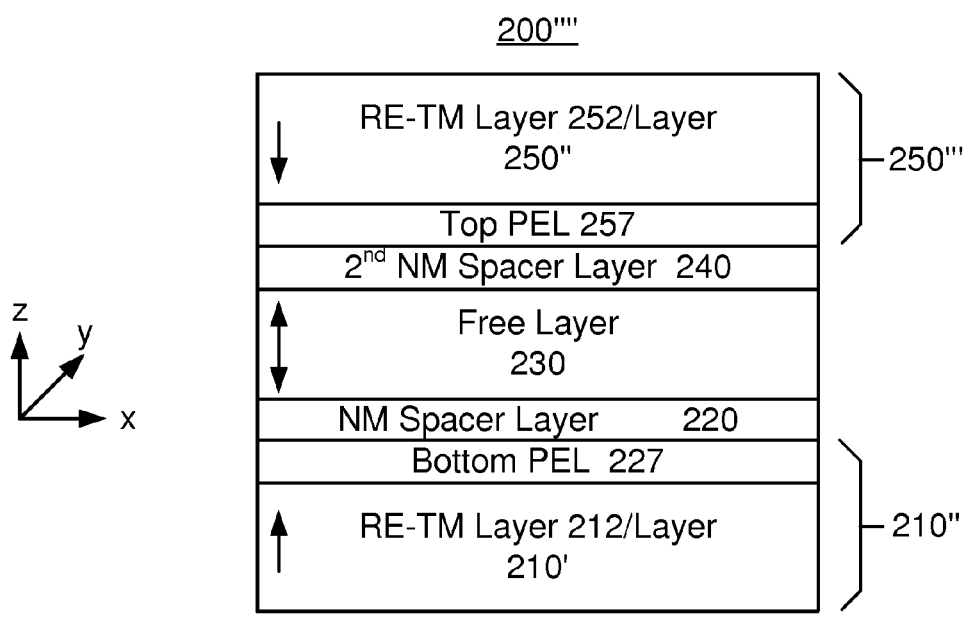
FIG. 8 depicts another exemplary embodiment of a dual magnetic junction usable in a magnetic memory programmable using spin transfer torque and which includes at least two rare earth-transition metal layers.

FIG. 8 depicts another exemplary embodiment of a magnetic junction 200″″ usable in a magnetic memory programmable using spin transfer torque and which includes at least two rare earth-transition metal layers. For clarity, FIG. 8 is not to scale and not all of the magnetic junction 200″″ may be shown. The magnetic junction 200″″ may be used in a magnetic device such as a STT-MRAM and, therefore, in a variety of electronic devices. The magnetic junction 200″″ is analogous to the magnetic junction 200, 200′, 200″ and/or 200′″ and thus to the magnetic junction 100. Consequently, analogous components are labeled similarly. Thus, the magnetic junction 200″″ includes a reference layer 210″, a nonmagnetic spacer layer 220, a free layer 230, an additional nonmagnetic spacer layer 240 and an additional pinned layer 250′″ that are analogous to the layers 210/210′, 220, 230, 240 and 250/250′/250″, respectively, for the magnetic junctions 200, 200, 200″ and/or 200′″. In addition, the layers 210″, 220, 240 and 250′″ are configured such that the stable states of the magnetic junction 200″″ are distinguishable via magnetoresistance. Further, the reference layers 210″ and 250′″ are depicted with the magnetic moments in a dual state. In other embodiments, the magnetic moments may be in an antidual state or switchable between dual and antidual states. For simplicity, no other layers such as seed, capping, and contact layers, are shown.

In the embodiment shown in FIG. 8, the reference layer 210″ includes a RE-TM layer 212/layer 250′ as well as a polarization enhancement layer (PEL). Similarly, the reference layer 250''' includes a RE-TM layer 252/layer 250' as well as a PEL 257. The layers 210' and 250" are analogous to the layers 210" and 250" depicted in FIG. 7. Referring back to FIG. 8, the layer 210' may consists of a single RE-TM layer 212. The layer 250" consists of a single RE-TM layer 252 in some embodiments. Both of the layers 210' and 250" may consist of a single RE-TM layer 212 and 252, respectively. In other embodiments, the layers 210' and 250" may be multilayers including a single RE-TM layer 212 and 252, respectively. For example, the layer 210' and/or 250" may be a SAF in which one of the magnetic layers is an RE-TM layer 212 and/or 252, respectively.

One or both of the reference layers 210" and 250''' includes a PEL 227 and 257, respectively. In some embodiments, only one of the reference layers 210" or 250" includes a PEL 227 or 257, respectively. In other embodiments, both reference layers 210" and 250''' include a PEL 227 and 257. The PELs 227 and 257 are layers having a high spin polarization. For example, the PELs 227 and 257 may each be a CoFeB or a FeB layer.

The reference layers 250''' and 210" are configured to have saturation magnetization quantities that match throughout the operating temperature range of the magnetic junction 200'''. In some embodiments, this means that the RE-TM layers 212 and 252/layers 210' and 250" have matching saturation magnetization quantities throughout the operating temperature range. In such embodiments, the magnetic properties of the PELs 227 and 257 may be separately tailored to provide the desired characteristics in the magnetic junction 200''''. In other embodiments, it is the combination of the saturation magnetization quantities for the layers 210'/212 and 227 that match the combination of the saturation magnetization quantities of the layers 250"/252 and 257. As a result, the shift field at the free layer 230 is substantially zero.

Because the saturation magnetization quantities of the reference layers 210" and 250''' match, performance of the magnetic junction 200'''' may be improved. Matching the saturation magnetization quantities of the layers 210" and 250''' allows for the shift field is substantially zero at the free layer 230. As a result, the magnetic junction 200'''' may be symmetric for read and write operations. Thus, performance of the magnetic junction 200'''' may be improved.

Figure 9:
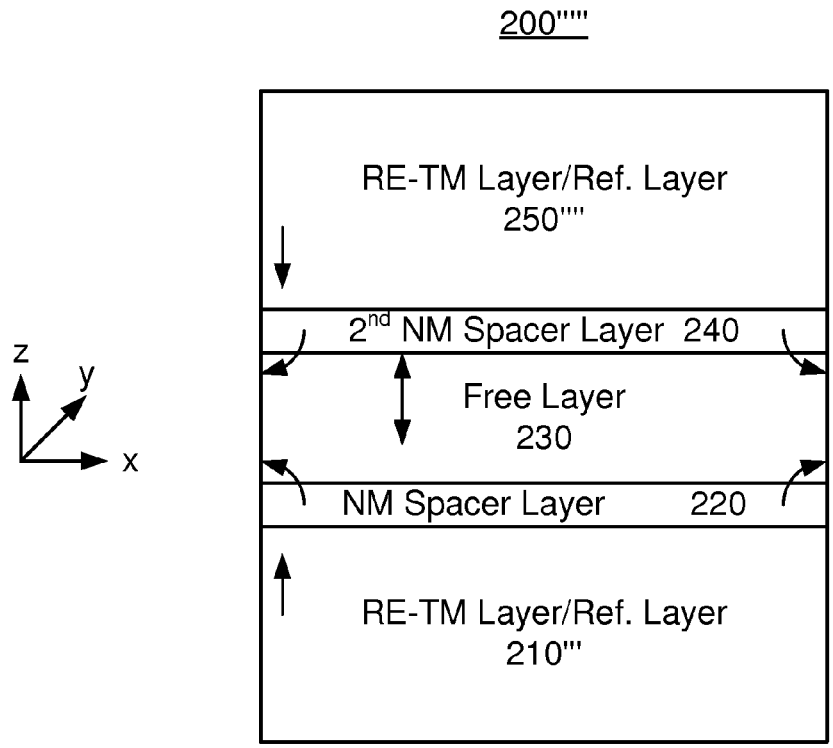
FIG. 9 depicts another exemplary embodiment of a dual magnetic junction usable in a magnetic memory programmable using spin transfer torque and which includes at least two rare earth-transition metal layers.

FIG. 9 depicts another exemplary embodiment of a magnetic junction 200'''' usable in a magnetic memory programmable using spin transfer torque and which includes at least two rare earth-transition metal layers. For clarity, FIG. 9 is not to scale and not all of the magnetic junction 200'''' may be shown. The magnetic junction 200'''' may be used in a magnetic device such as a STT-MRAM and, therefore, in a variety of electronic devices. The magnetic junction 200'''' is analogous to the magnetic junction 200, 200', 200", 200''' and/or 200'''' and thus to the magnetic junction 100. Consequently, analogous components are labeled similarly. Thus, the magnetic junction 200'''' includes a reference layer 210''', a nonmagnetic spacer layer 220, a free layer 230, an additional nonmagnetic spacer layer 240 and an additional pinned layer 250'''' that are analogous to the layers 210/210'/210", 220, 230, 240 and 250/250'/250"/250''', respectively, for the magnetic junctions 200, 200', 200", 200''' and/or 200''''. In addition, the layers 210''', 220, 240 and 250'''' are configured such that the stable states of the magnetic junction 200'''' are distinguishable via magnetoresistance. Further, the reference layers 210''' and 250'''' are depicted with the magnetic moments in a dual state. In other embodiments, the magnetic moments may be in an antidual state or switchable between dual and antidual states. For simplicity, no other layers such as seed, capping, and contact layers, are shown. In the embodiment shown in FIG. 9, the reference layers 210''' and 250'''' have a matching saturation quantities over the operating temperature range. The reference layers 210''' and 250'''' each include one or more RE-TM layers. As a result, the shift field at the free layer 230 is substantially zero.

In addition, the saturation magnetization quantities, such as the saturation magnetization and/or magnetic moment, are configured to provide an assist field during writing. The assist magnetic field provided by the reference layers 210''' and 250'''' is shown by curved arrows near the edges of the free layer 230. These curved arrows correspond to the stray fields due to the layers 210''' and 250''''. The stray field is also enhanced during writing. This may be because the saturation magnetization quantity such as magnetic moment is increased in the write temperature range.

Figure 10:
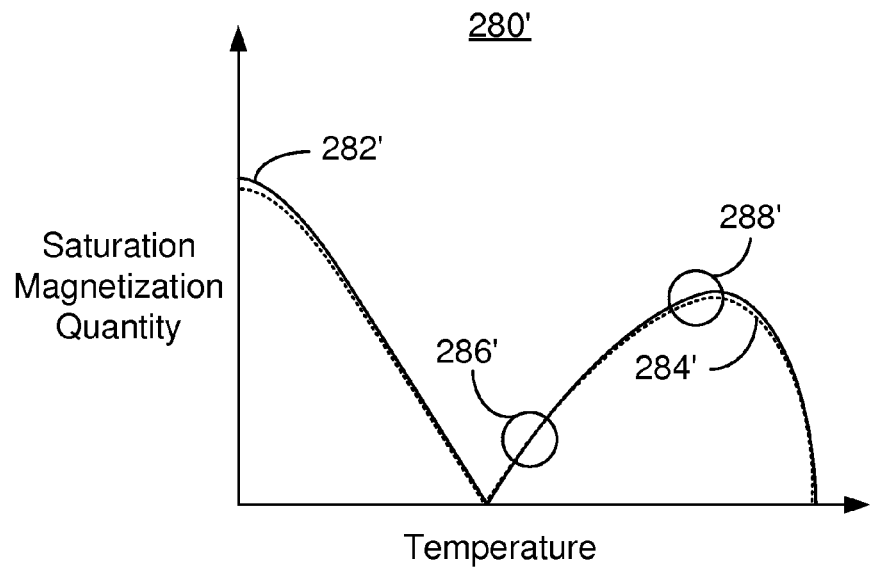
FIG. 10 is a graph depicting an exemplary embodiment of the saturation magnetization versus temperature for a magnetic junction including at least two rare earth-transition metal layers.

This feature is explained in connection with FIG. 10, which includes a graph 280' depicting an exemplary embodiment of the saturation magnetization quantity versus temperature constant for the magnetic junction 200''''. Curve 282' depicts the saturation magnetization quantity versus temperature for the RE-TM layer(s) in the reference layer 210'''. The curve 284' depicts the saturation magnetization quantity versus temperature for the RE-TM layer(s) in the reference layer 250''''. Region 286' corresponds to the standby temperature range, while region 288' corresponds to the write temperature range. As can be seen by the curves 282' and 284' in FIG. 10, the saturation magnetization quantities of the reference layers 210''' and 250'''', respectively, match over the operating temperature range. In addition, the saturation magnetization quantity, such as magnetic moment of the ferrimagnet(s) in the layers 210''' and 250''' increases with increasing temperature over the operating temperature range. More importantly, the saturation magnetization quantity for the reference layers 210''' and 250'''' is larger during write than during standby. In some embodiments, the magnetic moment at the standby temperature range is not more than one-fourth of the magnetic moment in the write temperature range. Consequently, the stray fields at the free layer 230 are larger during write than during standby. At standby, the smaller stray fields from the reference layers 210''' and 250''' are less likely to affect the magnetic moment of the free layer 230. Stated differently, the free layer magnetic moment may be more stable during standby. During a write operation, however, the stray fields due to the moments of the reference layers 210''' and 250'''' are larger. Thus, these stray fields may be used to assist in switching the state of the magnetic moment of the free layer 230. Consequently, switching of the magnetic junction 200'''' may be improved.

Performance of the magnetic junction 200'''' may be improved. Matching the saturation magnetization quantities of the layers 210''' and 250'''' allows for the shift field is substantially zero at the free layer 230. As a result, the magnetic junction 200'''' may be symmetric for read and write operations. In addition, the magnetic moments of the layers RE-TM layers of the reference layers 210''' and 250'''' are higher in the write temperature range. Stray fields from the reference layers 210''' and 250''' at the free layer 230 may assist in switching the magnetic moment of the free layer 230. Switching may then be performed more rapidly and/or at a lower write current. Thus, performance of the magnetic junction 200'''' may be improved.

FIG. 11 depicts an exemplary embodiment of a RE-TM layer 260 that may be used in a magnetic junction. For clarity, FIG. 11 is not to scale. The RE-TM layer 260 includes at least a RE-TM alloy sublayer 261-1. The RE-TM alloy 261-1 has the desired stoichiometry, doping, oxygen content, hydrogen content and/or other features to provide the desired magnetic and other properties. The RE-TM alloy 261-1 is an alloy of a rare earth and a transition metal. For example, such alloys might include $Tb_x(Fe_yCo_{1-y})_{1-x}$, $Tb_xCo_{1-x}$, $Tb_xFe_{1-x}$, $Gd_xCo_{1-x}$, $Gd_x(Fe_yCo_{1-y})_{1-x}$ and $Gd_xFe_{1-x}$, where x and y are each greater than zero and less than one. Other RE-TM alloys might also be used. In addition, the RE-TM alloy 261-1 may also be doped. For example, materials such as B, Cu, Zr, Al, Si and other dopants may be used. The amount of oxygen, hydrogen and other light elements may also be controlled during fabrication to ensure that the RE-TM alloy 261-1 has the desired properties.

The RE-TM layer 260 may be a single layer including the RE-TM alloy 261-1. In such embodiments, the RE-TM alloy 261-1 may have varying concentrations of one or more constituents. In some embodiments, the RE-TM layer 260 may be a multilayer including two RE-TM alloy sublayers. Thus, an additional optional RE-TM alloy sublayer 261-2 is also shown. Like the RE-TM alloy 261-1, the RE-TM alloy 261-2 has the desired stoichiometry, dopants, and other properties. Further, additional RE-TM alloy sublayers (not shown) might be included in the RE-TM layer 260. Thus, the RE-TM layer 260 includes one or more RE-TM alloys.

FIG. 12 depicts another exemplary embodiment of a RE-TM layer 260' that may be used in a magnetic junction. For clarity, FIG. 12 is not to scale. The RE-TM layer 260' is a multilayer, including multiple sublayers. These sublayers may include various materials. In the embodiment shown, some sublayers are Re-TM alloys, while others are other metals. The RE-TM layer 260' includes RE-TM alloy sublayers 262-1, 262-2, 262-3, 262-4, 262-5 and 262-6 (collectively 262). Also included are transition metal sublayers 264-1, 264-2, 264-3, 264-4, 264-5, 264-6 and 264-7 (collectively 264). Although a particular number of repeats of the sublayers 262-i and 264-j are shown, another number of repeats may be used. In addition, the outermost sublayers 264-1 and 264-7 are transition metals. In another embodiment, one or both of the outermost layers might be a RE-TM alloy. In addition, the RE-TM alloys 262 may be different. For example, some of the RE-TM alloys 262 may be TbCo while others are GdCo. In other embodiments, the RE-TM alloys 262 may all be the same. Each of the RE-TM alloys 262 may also include multiple alloy sublayers. For example, each RE-TM alloy 262 may be the RE-TM layer 260. Similarly, the metal sublayers 264 may be the same. For example, the metal sublayers 264 may all be Fe. In such embodiments, the thickness of each metal sublayer 264 may be not more than seven Angstroms. In other embodiments, the sublayers 264 may differ. For example, a RE-TM sublayer 262 of TbCo may be alternated with Fe sublayers 264 to form a multilayer RE-TM layer 260'. Because a multilayer is used, the individual RE-TM alloys 262 and/or the metal layers 264 may be tailored so that the RE-TM layer 260' has the desired properties. Further, the use of the multilayer may allow the RE-TM layer 260' to be annealed at higher temperatures and remain with its magnetic moment perpendicular to plane. Such an orientation of the magnetic moment may be desired.

The RE-TM layer(s) 260 and/or 260' may be used in one or more of the magnetic junctions 100, 200, 200', 200", 200''', 200'''' and/or 200'''''. For example, the RE-TM layer 260 may be used in both the layers 210'/212 and 250"/252 in the magnetic junction 250''' of FIG. 7. Alternatively, the RE-TM layer 260' may be used in the layer 210'/212, while the RE-TM layer 260' may be used in the layer 250"/252 of FIG. 7. Similarly, the RE-TM layer 260' may be used in the layers 212 and 216 of the layer 210 in the magnetic junction 200' of FIG. 5. In another embodiment, the RE-TM layer 260 may be used for the layer 212 while the RE-TM 260' may be used for the layer 216 in the reference layer 210 of the magnetic junction 200'. In other embodiments, other RE-TM layers might be used. Thus, the stoichiometry, constituents, dopants, number of RE-TM alloys, single or multilayers such are layers 260 and 260' and other features may be mixed and matched in the RE-TM layers for the magnetic junctions 100, 200, 200', 200", 200''', 200'''' and/or 200'''''. Thus, the benefits of the magnetic junctions 100, 200, 200', 200", 200''', 200'''' and/or 200''''' may be achieved.

Figure 13:
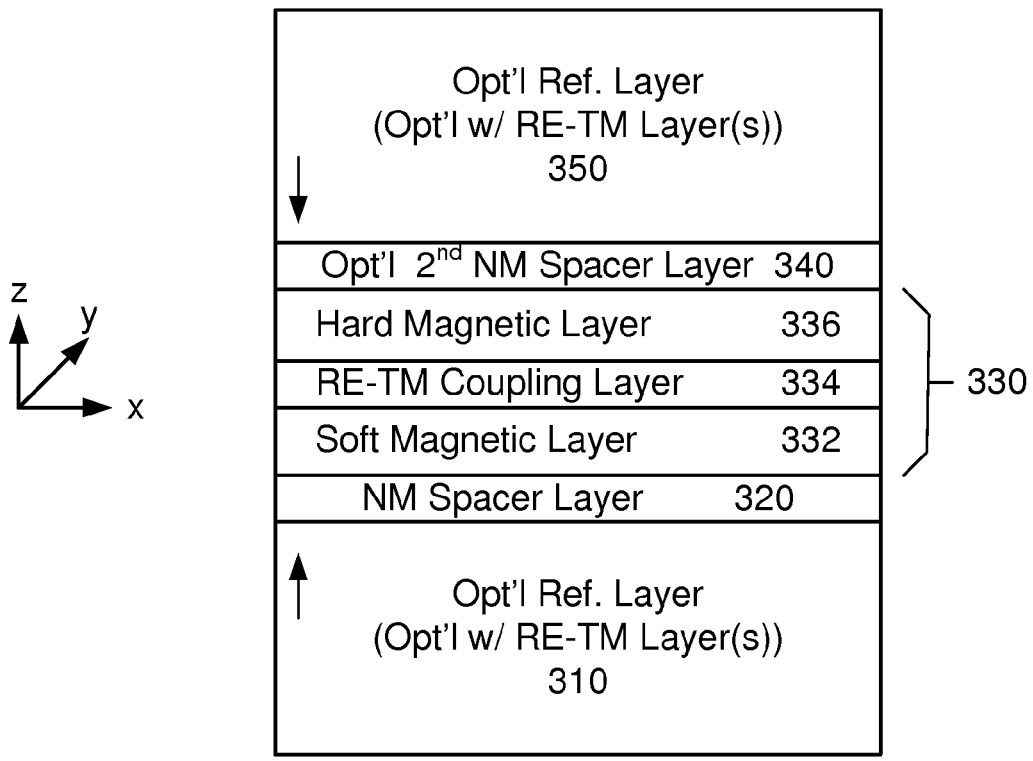
FIG. 13 depicts an exemplary embodiment of a dual magnetic junction usable in a magnetic memory programmable using spin transfer torque and which includes at least one rare earth-transition metal layer in the free layer.
Figure 14:
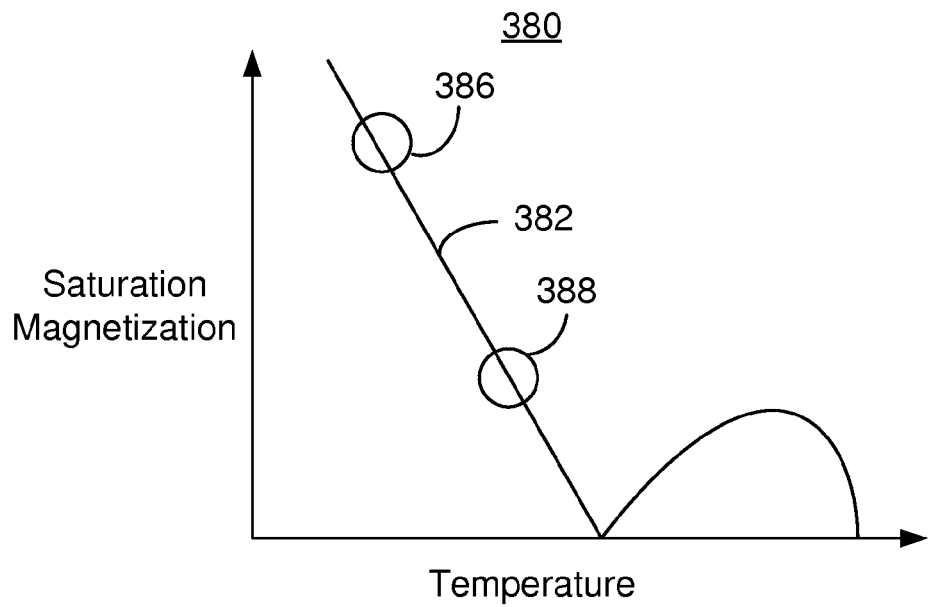
FIG. 14 is a graph depicting an exemplary embodiment of the saturation magnetization versus temperature for a magnetic junction including at least one rare earth-transition metal layer in the free layer.

FIG. 13 depicts another exemplary embodiment of a magnetic junction 300 usable in a magnetic memory programmable using spin transfer torque and which includes at least two rare earth-transition metal layers. For clarity, FIG. 13 is not to scale and not all of the magnetic junction 300 may be shown. FIG. 14 is a graph 370 depicting an exemplary embodiment of saturation magnetization versus temperature for the RE-TM layer of the magnetic junction 300. Referring to FIGS. 13-14, the magnetic junction 300 may be used in a magnetic device such as a STT-MRAM and, therefore, in a variety of electronic devices. The magnetic junction 300 is analogous to the magnetic junction(s) 100, 200, 200', 200", 200''', 200'''' and/or 200'''''. Consequently, analogous components are labeled similarly. Thus, the magnetic junction 300 includes a reference layer 30, a nonmagnetic spacer layer 320, a free layer 330, an optional additional nonmagnetic spacer layer 240 and an optional reference layer 350 that are analogous to the layers 110/210/210'/210"/210''', 120/220, 130/230, 140/240 and 150/250/250'/250"/250'''/250'''', respectively, for the magnetic junctions 100, 200, 200', 200", 200''', 200'''' and/or 200'''''. For simplicity, no other layers are shown. Thus, the underlying substrate 101, contacts 102 and 103, optional seed layer 104, optional pinning layers 106 and 109, and optional capping layer 108 depicted with the magnetic junction 100 are not shown in FIG. 13. In the embodiment shown in FIG. 13, therefore, the magnetic junction 300 may be a single magnetic junction or a dual magnetic junction. If a single magnetic junction, then the free layer 330 may be at the top or bottom of the magnetic junction 300.

The reference layers 310 and 350 may include RE-TM layers or not. If RE-TM layers are included in one or both of the reference layers 310 and 350, then the saturation magnetization quantities match over at least the operating temperature range. For example, the moment, saturation magnetization, and/or saturation magnetization-thickness product may match for the RE-TM layers. As a result, the shift field at the free layer 330 may be substantially zero. Thus, behavior of the free layer 330 may be substantially symmetric with respect to a zero magnetic field.

The free layer 330 is analogous to the free layer 130. Thus, the free layer 230 is switchable between stable magnetic states using spin transfer. The free layer perpendicular magnetic anisotropy may exceed the out-of plane demagnetization energy. The magnetic moment of the free layer 330 may thus be perpendicular-to-plane. Thus, the stable states of the free layer 330 are along the z-axis. In other embodiments, the stable states of the free layer 330 may be in other directions.

In addition, the free layer 330 includes a RE-TM layer 334. The RE-TM layer may be or include one or more of the RE-TM layers 260 and 260' or other RE-TM layers described herein. Alternatively, other RE-TM layers having the desired properties may be used. In the embodiment shown, the RE-TM layer 334 is a coupling layer. Thus, the free layer 330 includes a soft ferromagnetic layer 332, a hard ferromagnetic layer 334 and the RE-TM layer 334 between the soft magnetic layer 332 and the hard magnetic layer 334. The soft magnetic layer 332 includes a material having a coercivity of less than one hundred Oe. In some embodiments, the coercivity of the soft magnetic layer 332 is not more than ten Oe. In contrast the hard magnetic layer 336 includes a material having a coercivity of greater than two hundred Oe. In some embodiments, the hard magnetic layer 336 has a coercivity of at least five hundred Oe. The RE-TM layer 334 magnetically couples the soft magnetic layer 332 with the hard magnetic layer 334.

In the embodiment 300 shown in FIG. 13, the magnetic moment of the RE-TM layer 334 is smaller during writing than during standby or other operation of the magnetic junction 300. This is shown in FIG. 14, which includes a curve 382 of the saturation magnetization of the RE-TM layer 334 versus temperature. Also shown are regions 386 and 388 that correspond to standby and write temperature ranges, respectively. The materials, magnetic moments, magnetic moment at write temperatures, and other properties of the RE-TM layer 334 may be analogous to those described above. Because the magnetic moment of the RE-TM layer 334 is reduced at write temperatures, the RE-TM layer 334 is less effective at magnetically coupling the layers 332 and 336 than at standby. The layers 332 and 336 may, therefore, be easier to switch.

Because the moment of the RE-TM layer 334 is reduced during writing, the coupling between the hard and soft magnetic layers of the free layer 330 may be reduced during writing. In such embodiments, the free layer 330 may be written at a lower current than if the RE-TM layer had the same or a higher magnetic moment. Thus, performance of the magnetic junction 300 may be improved. Performance of the magnetic junction 300 may be further enhanced by use of RE-TM layers in the reference layer(s) as described above with respect to FIGS. 2-10, Note that various features relating to the RE-TM layer(s) are discussed above with respect to the magnetic junctions 100, 200, 200', 200'', 200''', 200'''', 200''''' and 300 as well as in RE-TM layers 260 and 260'. Various features and configurations may be combined in a manner not inconsistent with the method and system that are not explicitly described.

Figure 15:
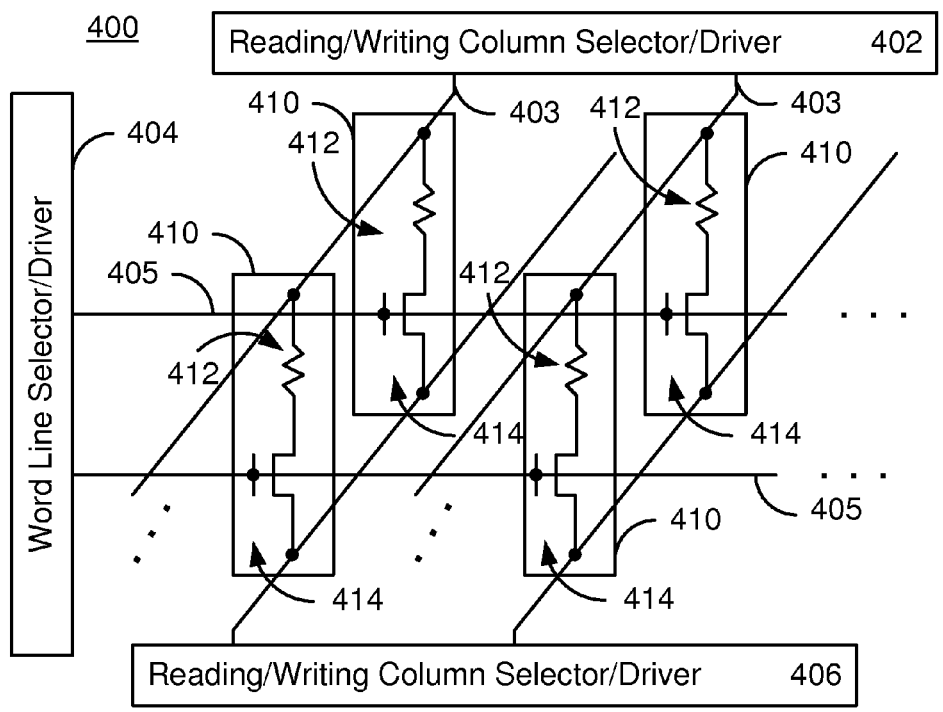
FIG. 15 depicts an exemplary embodiment of a memory utilizing magnetic junctions in the memory element(s) of the storage cell(s).

FIG. 15 depicts an exemplary embodiment of a memory 400 that may use one or more of the magnetic junctions 100, 200, 200', 200'', 200''', 200'''', 200''''' and/or 300. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 100, 200, 200', 200'', 200''', 200'''', 200''''' and/or 300. Thus, the magnetic junction 412 each has at least one RE-TM layer configured as described herein. Although one magnetic junction 412 is shown per cell 410, in other embodiments, another number of magnetic junctions 412 may be provided per cell. Further, although not shown, in some embodiments, the memory 400 may include a mechanism to assist in switching the magnetic junctions 412. As such, the magnetic memory 400 may enjoy the benefits described above.

Figure 16:
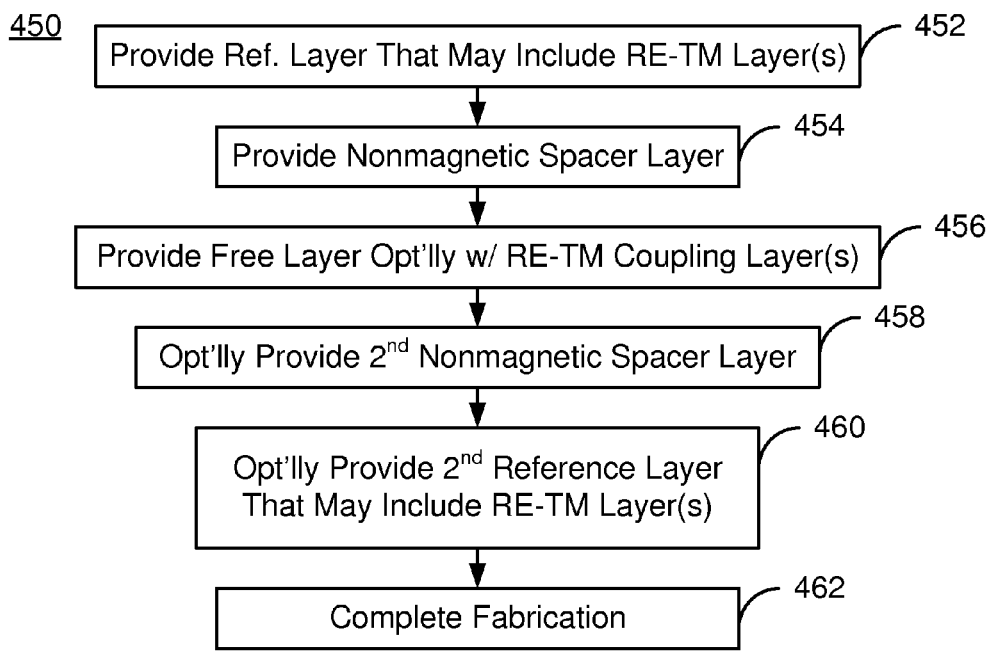
FIG. 16 is a flow chart depicting an exemplary embodiment of a method for providing a magnetic junction usable in an electronic device programmable using spin transfer torque and which includes at least one rare earth-transition metal layer.

FIG. 16 depicts an exemplary embodiment of a method 450 for fabricating a magnetic junction. For simplicity, some steps may be omitted or combined. The method 450 is described in the context of the magnetic junction 100. However, the method 450 may be used on other magnetic junctions including but not limited to the magnetic junctions 200, 200', 200'', 200''', 200'''', 200''''' and 300. Further, the method 450 may be incorporated into fabrication of magnetic memories. Thus the method 450 may be used in manufacturing a STT-MRAM or other magnetic memory, such as the memory 400.

The reference layer 110 that may include one or more RE-TM layers is provided, via step 452. The nonmagnetic layer 120 is provided, via step 454. Step 454 may include depositing the desired nonmagnetic materials. In addition, the desired thickness of material may be deposited in step 454. The free layer 130 is provided, via step 456. Step 456 may include providing a RE-TM layer in the free layer. The nonmagnetic layer 140 may optionally be provided, via step 458. Another reference layer 150 may optionally be provided, via step 460. Fabrication of the junction and/or memory may be completed, via step 454. For example, anneals or other processes may be performed. Additional structures might also be fabricated. Consequently, the benefits of the magnetic junction(s) 100, 200, 200', 200'', 200''', 200'''' and/or 300''''' may be achieved.

Figure 17:
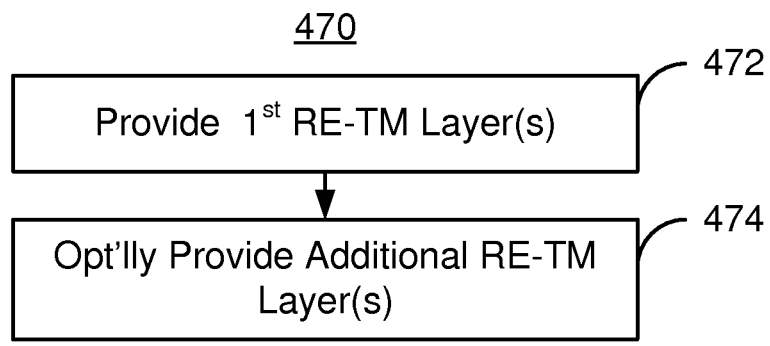
FIG. 17 depicts an exemplary embodiment of a method for providing a rare earth-transition metal layer.

FIG. 17 depicts an exemplary embodiment of a method 470 for providing a RE-TM layer for use in a magnetic junction. For simplicity, some steps may be omitted or combined. The method 470 is described in the context of the RE-TM layer 260. However, other RE-TM layers may be fabricated.

A first RE-TM layer 261-1 is provided, via step 472. Step 472 may include adjusting the oxygen concentration, doping, concentration of each constituent, and other methods. For example, the etch chemistries used in fabrication may be selected to preclude undue exposure to oxygen. A cold trap or other mechanism for trapping H and other low molecular weight atoms may be used. The amount of dopant and stoichiometry are also controlled.

The second RE-TM layer 261-2 may optionally been provided, via step 474. Step 474 is analogous to step 472. Thus, the desired RE-TM layer 260 may be formed and the benefits of the magnetic junction(s) 100, 200, 200', 200'', 200''', 200'''', 200''''' and/or 300 may be achieved.

Figure 18:
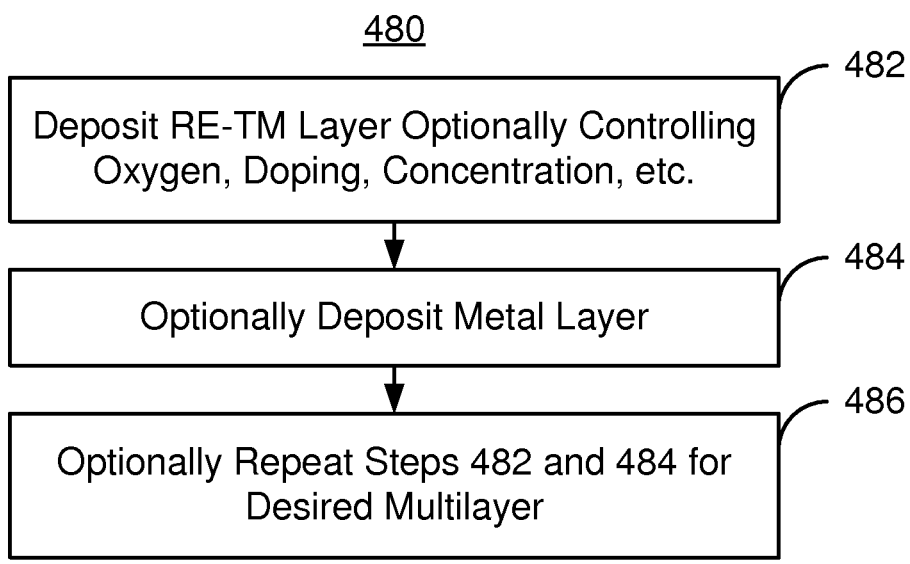
FIG. 18 depicts another exemplary embodiment of a method for providing a rare earth-transition metal layer.

FIG. 18 depicts an exemplary embodiment of a method 480 for providing a RE-TM layer for use in a magnetic junction. For simplicity, some steps may be omitted or combined. The method 480 is described in the context of the RE-TM layer 260'. However, other RE-TM layers may be fabricated.

A first RE-TM layer 262-1 is provided, via step 482. Step 482 may include adjusting the oxygen concentration, doping, concentration of each constituent, and other methods. For example, the etch chemistries used in fabrication may be selected to preclude undue exposure to oxygen. A cold trap or other mechanism for trapping H and other low molecular weight atoms may be used. The amount of dopant and stoichiometry are also controlled. In addition, the first RE-TM layer 262-1 may be provide on another layer of the reference layer 261.

A metal layer 264-2 is optionally deposited, via step 484. Step 484 may include depositing a transition metal, such as Fe. In other embodiments, other metals, including alloys, may be used. Steps 482 and/or 484 are optionally repeated until the desired multilayer structure is achieved, via step 284.

Thus, the desired RE-TM layer 260' may be formed using the method 480 and the benefits of the magnetic junction(s) 100, 200, 200', 200", 200"', 200"", 200""' and/or 300 may be achieved.

A method and system for providing a magnetic junction and an electronic device, such as one including a memory fabricated using the magnetic junction, has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device, the magnetic junction comprising:
    a reference layer including a first rare earth-transition metal (RE-TM) layer and a second RE-TM layer, the first RE-TM layer having a first saturation magnetization quantity, the second RE-TM layer having a second saturation magnetization quantity, the first saturation magnetization quantity matching the second saturation magnetization quantity over at least an operating temperature range;
    a nonmagnetic spacer layer; and
    a free layer, the nonmagnetic spacer layer being between the free layer and the reference layer, the free layer being switchable between a plurality of stable magnetic states when a write current is passed through the magnetic junction.

2. The magnetic junction of claim 1 wherein the first saturation magnetization quantity is a first saturation magnetization-thickness product, the second saturation magnetization quantity is a second saturation magnetization thickness product, the first saturation magnetization-thickness product matching the second saturation magnetization-thickness product over the at least the operating temperature range to within ten milli-emu/cm$^2$.

3. The magnetic junction of claim 1 wherein the first saturation magnetization quantity is a first saturation magnetization, the second saturation magnetization quantity is a second saturation magnetization, the first saturation magnetization matching the second saturation magnetization over the at least the operating temperature range to within fifty-thousand A/m.

4. The magnetic junction of claim 1 wherein the first saturation magnetization quantity and the second saturation magnetization quantity correspond to a shift field at the free layer and wherein the first saturation magnetization matching the second saturation magnetization over the at least the operating temperature range is a shift field of not more than ten Oe at the free layer over the at least the operating range.

5. The magnetic junction of claim 1 wherein the first saturation magnetization quantity is higher at a write temperature than at a standby temperature and wherein the second saturation magnetization quantity is higher at the write temperature than at the standby temperature.

6. The magnetic junction of claim 1 wherein the reference layer includes a polarization enhancement layer (PEL).

7. The magnetic junction of claim 1 further comprising:
    an additional nonmagnetic spacer layer, the free layer being between the nonmagnetic spacer layer and the additional nonmagnetic spacer layer; and
    an additional reference layer, the additional nonmagnetic spacer layer being between the additional reference layer and the free layer.

8. The magnetic junction of claim 7 wherein the reference layer includes a first polarization enhancement layer (PEL) and the additional reference layer includes a second PEL.

9. The magnetic junction of claim 8 wherein the first PEL has a first PEL saturation magnetization quantity, wherein the second PEL has a second PEL saturation magnetization quantity, wherein the first saturation magnetization thickness quantity includes the first PEL saturation magnetization quantity and the second saturation magnetization quantity includes the second PEL saturation magnetization quantity.

10. The magnetic junction of claim 7 wherein the reference layer includes the first RE-TM layer, wherein the additional reference layer includes the second RE-TM layer, wherein the first saturation magnetization is a first saturation magnetization, wherein the second saturation magnetization is a second saturation magnetization wherein the first saturation magnetization and the second saturation magnetization are less than fifty thousand A/m at a standby temperature and greater than one hundred thousand A/m at a write temperature.

11. The magnetic junction of claim 1 wherein at least one of the first RE-TM and the second RE-TM includes a multilayer including a plurality of RE-TM sublayers.

12. An electronic device comprising:
    a magnetic memory including a plurality of magnetic storage cells and a plurality of bit lines, each of the plurality of magnetic storage cells including at least one magnetic junction, each of the at least one magnetic junction including a reference layer, a nonmagnetic spacer layer, and a free layer, the nonmagnetic spacer layer being between the free layer and the reference layer, the free layer being switchable between a plurality of stable magnetic states when a write current is passed through the magnetic junction, the reference including a first rare earth-transition metal (RE-TM) layer and a second RE-TM layer, the first RE-TM layer having a first saturation magnetization quantity, the second RE-TM layer having a second saturation magnetization quantity, the first saturation magnetization quantity matching the second saturation magnetization quantity over at least an operating temperature range.

13. The electronic device of claim 12 wherein the at least one magnetic junction further includes:
    an additional nonmagnetic spacer layer, the free layer being between the nonmagnetic spacer layer and the additional nonmagnetic spacer layer; and
    an additional reference layer, the additional nonmagnetic spacer layer being between the additional reference layer and the free layer.

14. A method for providing a magnetic junction for use in a magnetic device, the method comprising:
    providing a reference layer including a first rare earth-transition metal (RE-TM) layer and a second RE-TM layer, the first RE-TM layer having a first saturation magnetization quantity, the second RE-TM layer having a second saturation magnetization quantity, the first saturation magnetization quantity matching the second saturation magnetization quantity over at least an operating temperature range;
    providing a nonmagnetic spacer layer; and
    providing a free layer, the nonmagnetic spacer layer being between the free layer and the reference layer, the free layer being switchable between a plurality of stable magnetic states when a write current is passed through the magnetic junction.

15. The method of claim 14 further comprising:
providing an additional nonmagnetic spacer layer, the free layer being between the nonmagnetic spacer layer and the additional nonmagnetic spacer layer; and
providing an additional reference layer, the additional nonmagnetic spacer layer being between the additional reference layer and the free layer.

16. The method of claim 15 wherein the step of providing the reference layer further includes:
providing a first polarization enhancement layer (PEL) and the additional reference layer includes a second PEL.

17. The method of claim 14 wherein the step of providing the first RE-TM layer further includes:
controlling an oxygen quantity in the RE-TM layer.

18. The electronic device of claim 12 wherein the free layer includes a hard magnetic layer, a soft magnetic layer and an additional RE-TM layer between the hard magnetic layer and the soft magnetic layer, the additional RE-TM layer having a standby magnetic moment in a standby temperature range and write magnetic moment in a write temperature range, standby magnetic moment being greater than the write magnetic moment.

19. The method of claim 14 wherein the free layer includes a hard magnetic layer, a soft magnetic layer and an additional RE-TM layer between the hard magnetic layer and the soft magnetic layer, the additional RE-TM layer having a standby magnetic moment in a standby temperature range and write magnetic moment in a write temperature range, standby magnetic moment being greater than the write magnetic moment.

* * * * *